(12) United States Patent
Lenski et al.

(10) Patent No.: US 8,440,559 B2
(45) Date of Patent: May 14, 2013

(54) WORK FUNCTION ADJUSTMENT IN HIGH-K METAL GATE ELECTRODE STRUCTURES BY SELECTIVELY REMOVING A BARRIER LAYER

(71) Applicant: Globalfoundries Inc., Grand Cayman (KY)

(72) Inventors: Markus Lenski, Dresden (DE); Klaus Hempel, Dresden (DE); Vivien Schroeder, Ottendorf-Okrilla (DE); Robert Binder, Dresden (DE); Joachim Metzger, Butzbach (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/624,235

(22) Filed: Sep. 21, 2012

(65) Prior Publication Data

US 2013/0017679 A1    Jan. 17, 2013

Related U.S. Application Data

(62) Division of application No. 12/785,185, filed on May 21, 2010, now Pat. No. 8,298,894.

(30) Foreign Application Priority Data

May 29, 2009   (DE) .......................... 10 2009 023 376

(51) Int. Cl.
*H01L 21/8234*     (2006.01)
(52) U.S. Cl.
USPC ............................. 438/591; 438/275; 438/199

(58) Field of Classification Search ................... 438/591, 438/275, 199
See application file for complete search history.

(56) References Cited

U.S. PATENT DOCUMENTS

| | | | |
|---|---|---|---|
| 6,583,012 B1 | 6/2003 | Buynoski et al. | 438/275 |
| 2007/0037343 A1 | 2/2007 | Colombo et al. | 438/231 |
| 2010/0087038 A1 | 4/2010 | Chung et al. | 438/199 |
| 2010/0087055 A1 | 4/2010 | Lai et al. | 438/585 |

FOREIGN PATENT DOCUMENTS

DE   102007005328 A1   9/2007

OTHER PUBLICATIONS

Translation of Official Communication from German Patent Office for German Patent Application No. 10 2009 023 376.8 dated Oct. 22, 2010.

*Primary Examiner* — Douglas Menz
(74) *Attorney, Agent, or Firm* — Williams, Morgan & Amerson, P.C.

(57) ABSTRACT

Generally, the present disclosure is directed work function adjustment in high-k metal gate electrode structures. In one illustrative embodiment, a method is disclosed that includes removing a placeholder material of a first gate electrode structure and a second gate electrode structure, and forming a first work function adjusting material layer in the first and second gate electrode structures, wherein the first work function adjusting material layer includes a tantalum nitride layer. The method further includes removing a portion of the first work function adjusting material layer from the second gate electrode structure by using the tantalum nitride layer as an etch stop layer, removing the tantalum nitride layer by performing a wet chemical etch process, and forming a second work function adjusting material layer in the second gate electrode structure and above a non-removed portion of the first work function adjusting material layer in the first gate electrode structure.

20 Claims, 5 Drawing Sheets

WORK FUNCTION ADJUSTMENT IN HIGH-K METAL GATE ELECTRODE STRUCTURES BY SELECTIVELY REMOVING A BARRIER LAYER

CROSS-REFERENCE TO RELATED APPLICATION

This is a divisional of co-pending application Ser. No. 12/785,185, filed May 21, 2010.

BACKGROUND OF THE INVENTION

1. Field of the Invention

Generally, the present disclosure relates to the fabrication of sophisticated integrated circuits including transistor elements comprising highly capacitive gate structures on the basis of a high-k gate dielectric material of increased permittivity and a work function metal.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range or 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials, such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold of the completed transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like.

For this reason, in some approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure. In a corresponding replacement gate approach, the high-k dielectric material may be formed and may be covered by an appropriate metal-containing material, such as titanium nitride and the like, followed by a standard polysilicon or amorphous silicon material, which may then be patterned on the basis of well-established advanced lithography and etch techniques. Consequently, during the process sequence for patterning the gate electrode structure, the sensitive high-k dielectric material may be protected by the metal-containing material, possibly in combination with sophisticated sidewall spacer structures, thereby substantially avoiding any undue material modification during the further processing. After patterning the gate electrode structure, conventional and well-established process techniques for forming the drain and source regions having the desired complex dopant profile are typically performed. After any high temperature processes, the further processing may be continued, for instance, by forming a metal silicide, if required, followed by the deposition of an interlayer dielectric material, such as silicon nitride in combination with silicon dioxide and the like. In this manufacturing stage, a top surface of the gate electrode structures embedded in the interlayer dielectric material may be exposed, for instance, by etch techniques, chemical mechanical polishing (CMP) and the like. In many cases, the polysilicon material may be removed in both types of gate electrode structure in a common etch process and thereafter an appropriate masking regime may be applied in order to selectively fill in an appropriate metal, which may be accomplished by filling in the first metal species and selectively removing the metal species from one of the gate electrode structures. Thereafter, a further metal material may be deposited, thereby obtaining the desired work function for each type of transistor.

Although in general this approach may provide advantages in view of reducing process related non-uniformities in the threshold voltages of the transistors since the high-k dielectric material may be reliably encapsulated during the entire process sequence without requiring an adjustment of the work function and thus the threshold voltage at an early manufacturing stage, the complex process sequence for removing the placeholder material and providing appropriate work function materials for the different types of transistors may also result in a significant degree of variability of the transistor characteristics, which may thus result in offsetting at least some of the advantages obtained by the common processing of the gate electrode structures until the basic transistor configuration is completed. With reference to FIGS. 1a-1c, a typical conventional process strategy will be described in order to illustrate in more detail any problems related to the provision of work function materials for P-channel transistors and N-channel transistors on the basis of a replacement gate approach.

FIG. 1a schematically illustrates a cross-sectional view of a sophisticated semiconductor device 100 in an advanced manufacturing stage, i.e., in a manufacturing stage in which a first transistor 150A, such as a P-channel transistor, and a second transistor 150B, such as an N-channel transistor, are formed in and above corresponding active regions 103A, 103B. The active regions 103A, 103B are laterally delineated by an isolation structure 103C, which is typically comprised of appropriate dielectric materials, such as silicon dioxide, silicon nitride and the like. Moreover, in the advanced manufacturing stage illustrated in FIG. 1a, drain and source regions 153 are provided, possibly in combination with metal silicide regions 154 in order to enhance overall conductivity when forming contact elements that connect to the drain and source regions 153 in a later manufacturing stage. The drain and source regions 153 laterally enclose a channel region 152, the threshold voltage of which may have to be adjusted on the basis of the drain and source regions 153, the general conductivity of the channel region 152 and on the basis of an appropriate gate electrode structure. In the manufacturing stage shown, the transistors 150A, 150B comprise respective gate electrode structures 160A, 160B. The gate electrode structures 160A, 160B may comprise a gate insulation layer 161 that comprises a high-k dielectric material, for instance in the form of hafnium oxide, hafnium silicon oxide and the like. Furthermore, additional "conventional" dielectric materials, such as silicon dioxide-based materials, may be incorporated into the gate insulation layer 161, for instance in view of providing a superior interface with the channel region 152. A titanium nitride cap layer 162 is formed on the gate insulation layer 161, followed by a silicon dioxide-based liner material 163, which may have formed on the cap material 162 in an early manufacturing stage. Furthermore, a tantalum nitride layer 164 in combination with a titanium nitride layer 165 are formed in the gate electrode structures 160A, 160B, wherein, in the example shown in FIG. 1a, the titanium nitride material 165 may represent a work function adjusting material for the transistor 150A, which has to be removed from the gate electrode structure 160B so as to provide therein a further work function adjusting material that is appropriate for the transistor 150B. As is further illustrated in FIG. 1a, the gate electrode structures 160A, 160B may be laterally embedded in a dielectric material, such as a spacer structure 155 and a portion of an interlayer dielectric material 110, which is provided in the form of a silicon nitride-based material 111 and a silicon dioxide material 112.

The semiconductor device 100 as illustrated in FIG. 1a may be formed on the basis of the following conventional process strategy. After forming the active regions 103A, 103B by providing the isolation structure 103C based on well-established process techniques, a gate material stack may be formed, for instance, by providing a conventional gate dielectric base layer, such as a silicon dioxide-based material, followed by a high-k dielectric material, which may be covered by the titanium nitride layer 162. Thereafter, a placeholder material, such as a silicon material, for instance in the form of an amorphous silicon material or a polysilicon material, is deposited, possibly in combination with further materials, such as cap layers and the like, as may typically be required for patterning the gate layer stack and for the further processing of the device 100. During the deposition of the placeholder material, i.e., the silicon material, typically the cap layer 162 may be exposed to an oxygen-containing ambient, which may result in an incorporation of an oxygen species, which is typically converted into a silicon and oxygen-containing material upon depositing the silicon material, thereby forming the liner 163. Next, advanced lithography and patterning strategies may be applied in order to form replacement gate electrode structures having a desired gate length, wherein the sensitive gate insulation layer 161 may be protected by the cap layer 162. Thereafter, the integrity of the sensitive materials 161 and 162 may be increased by providing a sidewall liner 166, for instance by forming a silicon nitride material. Thereafter, the further processing may be continued by forming the drain and source regions 153 in combination with the spacer structure 155, which may be accomplished by any appropriate manufacturing strategy. Thereafter, the metal silicide regions 154 may be formed by well-established process techniques followed by the deposition of the interlayer material 110, for instance in the form of materials 111 and 112. Next, the top surface of the gate electrode structures 160A, 160B may be exposed by removing material of the layer 110, for instance by CMP followed by a selective etch process, for instance based on wet chemical etch recipes and the like, in order to remove the placeholder material, i.e., the silicon material selectively to the spacer structure 155 and the interlayer dielectric material 110. For example, the plurality of efficient wet chemical etch recipes are available, such as potassium hydroxide-based agents, TMAH (tetramethyl ammonium hydroxide) and the like. The etch process may be stopped on the cap layer 162 or, if still present, on the liner 163, depending on the overall process strategy. Thereafter, the tantalum nitride layer 164 is deposited, for instance, by sputter deposition and the like, followed by the deposition of the titanium nitride material 165, which represents the actual work function material for the transistor 150A. The tantalum nitride layer 164 with a thickness of typically less than 5 nm is provided so as to act as an etch stop material for removing the material 165 selectively from the gate electrode structure 160B. For this purpose, an appropriate etch mask 104 is provided, for instance in the form of a resist material and the like, in order to expose the transistor 150B.

FIG. 1b schematically illustrates the semiconductor device 100 when exposed to an etch process 105 for removing the titanium nitride layer 165 (FIG. 1a) selectively to the etch stop layer 164. For convenience, only the transistor 150B is illustrated in FIG. 1b.

As previously explained, the adjustment of the final work function critically depends on the material species positioned close to the channel region 152, i.e., the gate insulation layer 161 and the titanium nitride cap material 162, possibly in combination with the liner 163, if still present. Furthermore, although titanium nitride may represent a material that may be appropriate for obtaining a desired work function for the transistor 150A, the transistor 150B may require a different atomic species, such as aluminum, lanthanum and the like, in order to obtain the desired high value for the work function, which finally results in the desired threshold voltage of the transistor 150B. Consequently, the tantalum nitride material 164 may be considered disadvantageous in appropriately positioning the work function adjusting material for the transistor 150B in close proximity to the channel region 152 with a high degree of reliability and process uniformity. That is, the tantalum nitride material 164 may generally suppress the diffusion of the desired species such as lanthanum and may have also experienced the etch process 105, thereby resulting in a more or less pronounced degree of modification, which may thus also result in a certain degree of variability during the further processing in adjusting the threshold voltage of the transistor 150B. For this reason, it is highly desirable to remove the tantalum nitride material 164 prior to depositing the work function adjusting material for the transistor 150B.

FIG. 1c schematically illustrates the semiconductor device 100 in a manufacturing stage in which the transistor 150B may be exposed to a sputter etch ambient 106 in order to remove a bottom portion of the tantalum nitride material, which may result in the formation of "sidewall" spacers 164S of the remaining tantalum nitride material. The sputter etch ambient 106 may typically be established prior to a sputter deposition process for depositing the work function material for the transistor 150B, while, in other cases, if this material has to be provided by a different deposition technique, the ambient 106 may be established as a separate process step. As previously indicated, generally, the thickness of the tantalum nitride material is in the range of 5 nm and less so that the removal process 106 may result in a modification of underlying materials, such as the materials 163, 162 and 161. Consequently, in an area 106C, a high probability of modifying or damaging the layer stack of the gate electrode structure 160B may exist, thereby contributing to a pronounced variability of the resulting transistor characteristics. Consequently, although the removal of the tantalum nitride material may be advantageous in view of a subsequent deposition of the work function material, the sputter etch process 106 may introduce additional process non-uniformities, which may offset the advantages obtained by the removal of the tantalum nitride material 164.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to advanced semiconductor devices and methods for forming the same in which gate electrode structures may be formed on the basis of a high-k dielectric material, wherein the work function for P-channel transistors and N-channel transistors may be adjusted after completing the basic transistor configuration with an increased degree of reliability and uniformity by avoiding plasma-based etch techniques, such as sputter etching. For this purpose, an efficient wet chemical etch recipe, in some illustrative embodiments based on ammonium hydroxide, may be used in order to remove a conductive barrier material such as a tantalum nitride material from one type of transistor, thereby creating enhanced conditions for providing a work function material for this transistor without unduly contributing to modification or damage of the remaining layer stack including a metal-containing cap material and the sensitive high-k dielectric material. Consequently, the adjustment of the work function for both types of transistors may be accomplished on the basis of superior process conditions, thereby resulting in a reduced degree of threshold variability substantially without increasing the probability of creating etch-related damage during the selective removal of a barrier material or work function material in one type of transistor.

One illustrative method disclosed herein comprises forming a first gate electrode structure above a first semiconductor region of a semiconductor device and forming a second gate electrode structure above a second semiconductor region, wherein the first and second gate electrode structures comprise a gate insulation layer including a high-k dielectric material, a metal-containing cap material formed on the gate insulation layer and a placeholder material. At least the second gate electrode structure comprises an etch stop liner that is located between the metal-containing cap material and the placeholder material. The method further comprises removing the placeholder material in the first and second gate electrode structures and forming one or more first material layers in the first and second gate electrode structures, wherein the one or more first material layers comprise a work function metal for the first gate electrode structure. The method further comprises removing the one or more first material layers selectively from the second gate electrode structure by using a wet chemical agent based on ammonium hydroxide to etch at least one of the one or more material layers. Additionally, the method comprises forming one or more second material layers in the second gate electrode structure, wherein the one or more second material layers comprise a work function metal for the second gate electrode structure.

A further illustrative method disclosed herein comprises removing a placeholder material of a first gate electrode structure and a second gate electrode structure. Moreover, the method comprises forming a first work function adjusting material layer in the first and second gate electrode structures, wherein the first work function adjusting material comprises a tantalum nitride layer. The method further comprises removing a portion of the first work function adjusting material layer from the second gate electrode structure by using the tantalum nitride layer as an etch stop layer. Additionally, the method comprises removing the tantalum nitride layer by performing a wet chemical etch process and forming a second work function adjusting material layer in the second gate electrode structure and above a non-removed portion of the first work function adjusting material layer in the first gate electrode structure.

One illustrative semiconductor device disclosed herein comprises a first transistor comprising a first gate electrode structure, wherein the first gate electrode structure comprises a first gate insulation layer including a high-k dielectric material, a metal-containing cap material formed above the high-k dielectric material, a tantalum nitride layer formed above the metal-containing cap material and a first work function adjusting material that is formed above the tantalum nitride layer. Moreover, the semiconductor device comprises a second transistor comprising a second gate electrode structure that in turn comprises a second gate insulation layer including the high-k dielectric material, the metal-containing cap material and a second work function adjusting material that is formed above the metal-containing cap material and that is formed on insulating sidewall surfaces of the second gate electrode structure.

BRIEF DESCRIPTION OF THE DRAWINGS

The disclosure may be understood by reference to the following description taken in conjunction with the accompanying drawings, in which like reference numerals identify like elements, and in which.

Figure 1A:
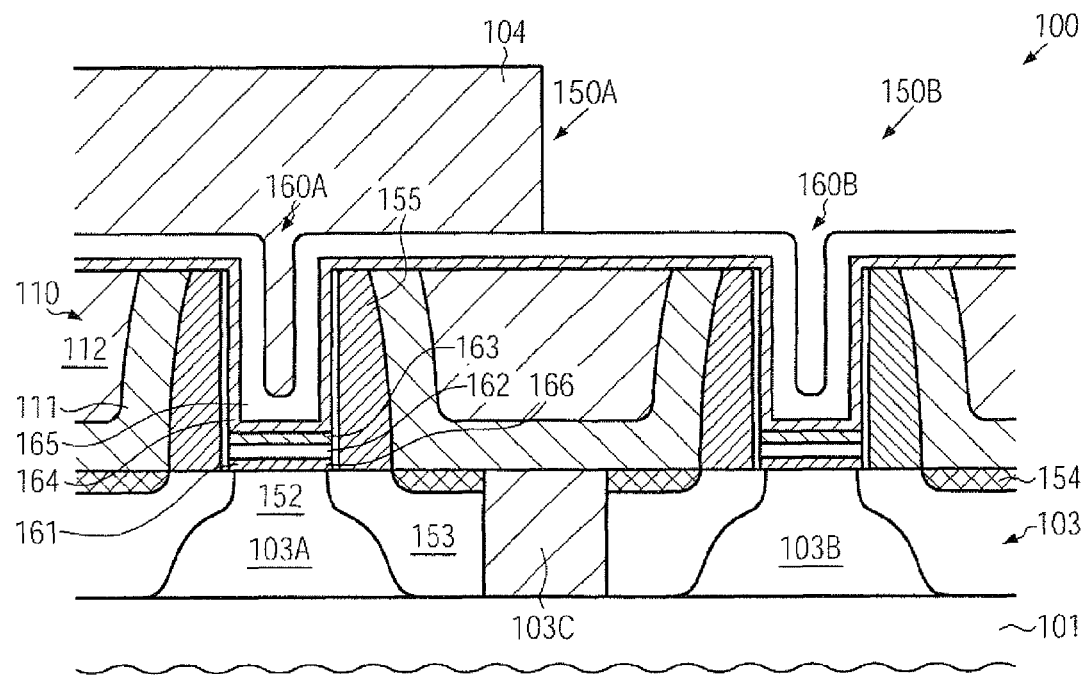
FIGS. 1a-1c schematically illustrate cross-sectional views of a semiconductor device during various manufacturing stages in adjusting the work function of sophisticated gate electrode structures on the basis of a tantalum nitride etch stop material and a selective removal thereof based on sputter etch techniques, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which a replacement gate approach may be applied that may provide superior process uniformity and thus reduced variability of transistor characteristics. To this end, unwanted conductive materials, such as titanium nitride, tantalum nitride and the like, may be removed selectively from one gate electrode structure after replacing a placeholder material, based on a wet chemical etch technique, thereby significantly reducing the probability of creating additional etch-related damage in the underlying sensitive gate layer stack. In one illustrative embodiment disclosed herein, a tantalum nitride material that may be efficiently used as an etch stop layer during the removal of a first work function adjusting material, such as a titanium nitride material, may be selectively removed from the other gate electrode structure by using a wet chemical agent, in one illustrative embodiment provided on the basis of an ammonium hydroxide/hydrogen peroxide mixture, which has been recognized to have a sufficient etch selectivity with respect to even thin dielectric materials, such as silicon dioxide, silicon and oxygen-containing dielectric liners and the like. Thus, in some illustrative embodiments, the conductive barrier or etch stop material may be efficiently removed by providing a corresponding liner material in one or both of the gate electrode structures in an early manufacturing stage, for instance upon depositing the placeholder material in the form of a silicon material, thereby maintaining a very efficient overall manufacturing flow compared to conventional strategies. On the other hand, an unwanted portion of the conductive barrier material, such as a tantalum nitride material, may be efficiently removed substantially without damaging the conductive cap material or the sensitive high-k dielectric material. Consequently, after the deposition of a further work function adjusting material layer, such as a lanthanum material, aluminum and the like, enhanced conditions for diffusing the desired metal species towards the sensitive gate insulation material may be established while nevertheless accomplishing a high degree of process uniformity. Therefore, replacement gate approaches in which the work function adjusting materials for both types of transistors may be provided in a very late manufacturing stage may be applied more efficiently and may result in superior transistor characteristics.

In still other illustrative embodiments, the high degree of etch selectivity of a wet chemical etch recipe may be used in order to provide a first work function adjusting material, such as a titanium nitride material, without an additional etch stop layer and selectively removing the same from the other type of transistors, thereby reducing the overall complexity of the manufacturing sequence.

Figure 1B:
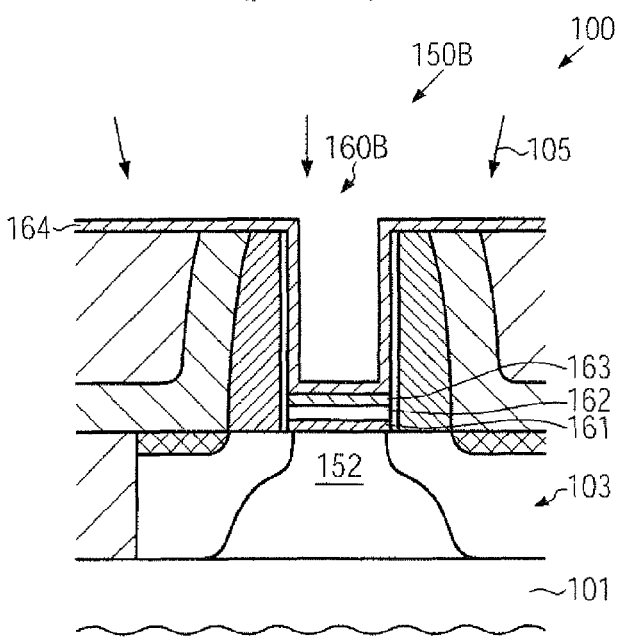
Figure 1C:
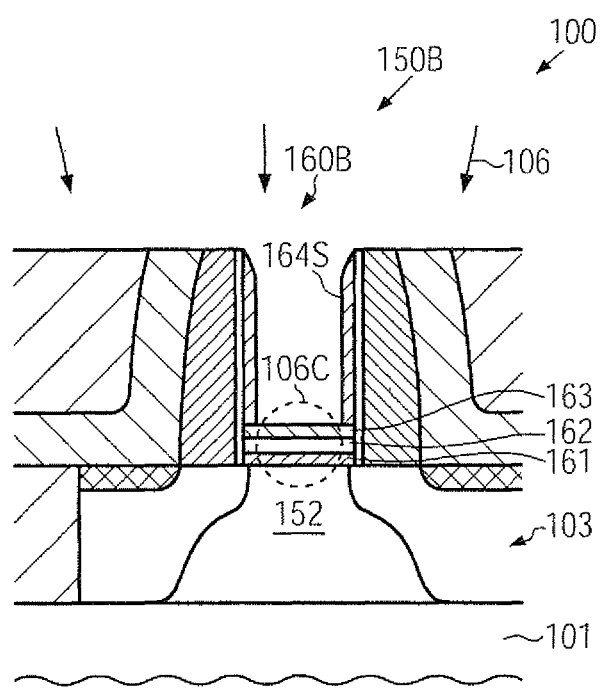

With reference to FIGS. 2a-2e, further illustrative embodiments will now be described in more detail wherein reference may also be made to FIGS. 1a-1c, if appropriate.

Figure 2A:
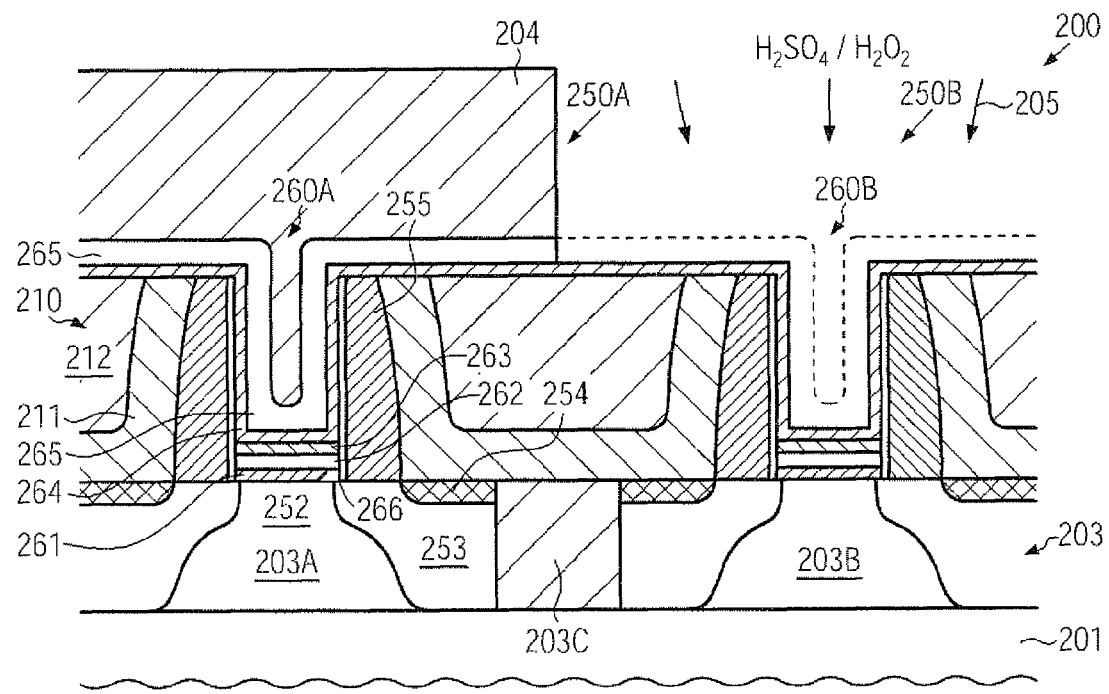
FIGS. 2a-2c schematically illustrate cross-sectional views of a semiconductor device during various manufacturing stages in providing two different work function adjusting material layers on the basis of a conductive etch stop material, such as a tantalum nitride material, that may be selectively removed on the basis of a wet chemical etch recipe, according to illustrative embodiments.

FIG. 2a schematically illustrates a cross-sectional view of a semiconductor device 200 in an advanced manufacturing stage. As illustrated, the device 200 may comprise a substrate 201 above which may be formed a semiconductor layer 203. The substrate 201 may represent any appropriate carrier material for forming thereabove the semiconductor layer 203, which may represent a silicon-based semiconductor material, a germanium-containing silicon material and the like. Furthermore, a buried insulating layer (not shown) may be formed between the substrate material 201 and the semiconductor layer 203, if an SOI (silicon-on-insulator) configuration is considered. In this case, corresponding active regions 203A, 203B formed in the semiconductor layer 203 on the basis of appropriate isolation structures 203C may be insulated from each other by the buried insulating layer and the isolation structures 203C. In other cases, a "bulk" configuration may be applied in which the semiconductor layer 203 may represent an upper portion of a crystalline semiconductor material of the substrate 201. If appropriate, a bulk configuration and an SOI configuration may both be used in different areas of the semiconductor device 200. Moreover, in the manufacturing stage shown, a transistor 250A may be formed in and above the active region 203A and may represent a P-channel transistor. Similarly, a second transistor 250B may be formed in and above the active region 203B and may represent an N-channel transistor. It should be appreciated, however, that in other cases the transistors 250A, 250B may generally represent transistors that may require different types of work function adjusting materials in order to obtain the desired threshold voltages, irrespective of their conductivity type. Moreover, the transistors 250A, 250B may comprise drain and source regions 253, which may comprise metal silicide regions 254. Gate electrode structures 260A, 260B of the transistors 250A, 250B, respectively, may comprise a gate insulation layer 261, which separates a conductive cap material 262 from a channel region 252. As previously discussed with reference to the semiconductor device 100, the gate insulation layer 261 may comprise a high-k dielectric material of any appropriate type, while the cap material 262 may represent any appropriate metal-containing and conductive material for protecting the sensitive material in the layer 261 and provide superior conditions during transistor operation, as previously explained. For example, the cap material 262 may be comprised of titanium nitride. Moreover, in the embodiment shown, each of the gate electrode structures 260A, 260B may comprise a liner material 263, for instance in the form of a silicon and oxygen-containing dielectric material with a thickness of approximately 1 nm to several nm, depending on the process strategy and the device requirements. In other illustrative embodiments, the liner material 263 may be selectively provided in the gate electrode structure 260B in order to act as an efficient etch stop material during further processing, while the material 263 in the gate electrode structure 260A may be omitted or may be provided with a significantly reduced thickness, thereby reducing a diffusion resistance in driving a certain metal species towards the gate insulation layer 261 of the transistor 250A in a later manufacturing stage. Moreover, in the manufacturing stage shown, a placeholder material such as a silicon material may be removed from the gate electrode structures 260A, 260B and a conductive barrier material or etch stop material 264 in combination with a first work function adjusting material 265 may be formed in the first and second gate electrode structures 260A, 260B. Furthermore, as also previously discussed with reference to the semiconductor device 100, a spacer structure 255, possibly in combination with a sidewall liner material 266, may laterally delineate the gate electrode structures 260A, 260B. Additionally, an interlayer dielectric material 210, possibly comprising various material layers such as layers 211 and 212, may be provided. It should be appreciated that, if required, one or more of the materials of the interlayer dielectric material 210 may be provided with a high internal stress level in order to enhance performance of one or both of the transistors 250A, 250B. For example, silicon nitride material, nitrogen-containing silicon carbide material and the like may be provided with a high internal stress level, such as a compressive and tensile stress level, which may be advantageous in modifying the charge carrier mobility in the channel regions 252.

The semiconductor device 200 as illustrated in FIG. 2a may be formed on the basis of process techniques which may, if desired, have a high degree of compatibility with conventional techniques, as previously described with reference to the semiconductor device 100. For example, in some illustrative embodiments, the active regions 203A, 203B and the gate electrode structures 260A, 260B may be formed on the basis of manufacturing techniques as described before. In other embodiments, forming the gate insulation layer 261 and the cap material 262 may be accompanied by an appropriate lithography process for providing the liner material 263 selectively in the gate electrode structure 260B, which may be accomplished by forming an appropriate dielectric liner with a desired material composition and thickness and subsequently selectively removing this material from above the active region 203A. As previously explained with reference to the semiconductor device 100, frequently, a silicon and oxygen-containing material may be formed upon depositing a placeholder material, such as an amorphous silicon material or a polysilicon material, and this material may be maintained as a liner material 263 throughout the following manufacturing sequence. In other cases, the creation of a corresponding silicon and oxygen-containing liner material may be suppressed by suppressing exposure of the device 200 to an oxygen-containing ambient and depositing at least a portion of the placeholder material without undue oxygen contents within the deposition atmosphere. Thereafter, a portion of the material may be treated, for instance, by incorporating oxygen in a very controllable manner, for instance, by wet chemical oxidation and the like, and selectively removing a corresponding oxidized portion on the basis of a masking regime and a selective etch chemical, wherein a remaining portion of the previously supplied placeholder material may be used as an efficient etch stop material so as to not unduly cause an interaction with the cap material 262. Thereafter, the remaining portion of the placeholder material, followed by any other materials as required for patterning the gate electrode structures and performing subsequent manufacturing processes, may be deposited. In this case, at least an asymmetry with respect to the liner material 263 may be created between the gate electrode structure 260A and the gate electrode structure 260B, if considered appropriate.

In the following, it may be assumed that a substantially uniform liner material 263 may be provided in the first and second gate electrode structures 260A, 260B with a thickness of approximately 0.5-5 nm, while higher values may also be used by appropriately controlling the exposure to oxygen, as previously discussed.

Subsequently the gate materials may be patterned, as previously described, followed by forming the sidewall liner 266, if required, in order to further enhance overall integrity of the materials 261 and 262. Next, the drain and source regions 253 in combination with the sidewall spacer 255 may be formed, followed by performing a silicidation sequence for providing the regions 254. Thereafter, the placeholder material may be removed on the basis of any appropriate wet chemical or plasma assisted etch process, wherein, at least in the second gate electrode structure 260B, the corresponding etch process may stop on the liner material 263. Next, the layers 264 and 265 may be deposited, for instance, by sputter deposition, chemical vapor deposition (CVD) and the like. Thereafter, a mask 204 may be provided so as to remove an exposed portion of the work function material selectively from the second transistor 250B. In one illustrative embodiment, an etch ambient 205 may be established by using a wet chemical etch recipe based on sulphuric acid ($H_2SO_4$) and hydrogen peroxide ($H_2O_2$), which may etch titanium nitride material while exhibiting a significantly reduced etch rate for a tantalum nitride material. Consequently, during the etch process 205, the material 265 may be efficiently removed without damaging the sensitive materials 262, 261 in the gate electrode structure 260B, even if the barrier layer 264 may be provided with a reduced thickness of approximately 5 nm and less.

Figure 2B:
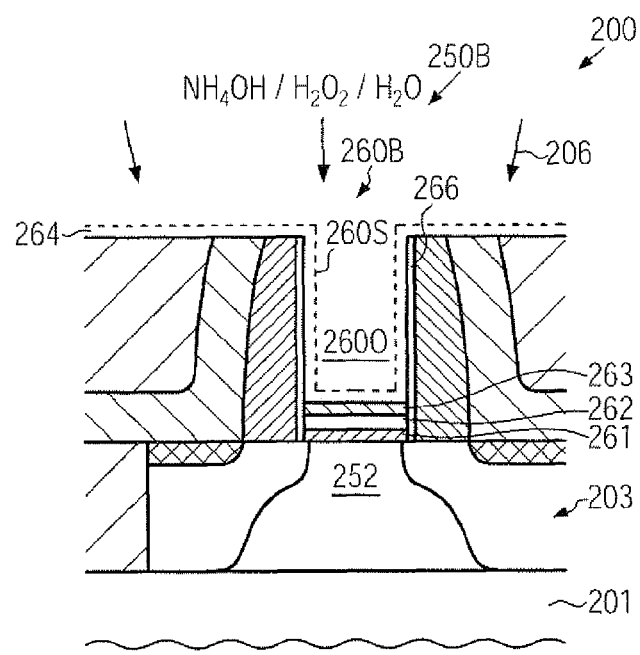

FIG. 2b schematically illustrates the transistor 250B of the device 200 in a further manufacturing stage. As illustrated, the device 200 may be exposed to an etch ambient 206 for removing the exposed portion of the etch stop layer 264 substantially without modifying at least the sensitive materials 262 and 261 in the gate electrode structure 260B. For this purpose, a wet chemical etch ambient may be established so as to substantially completely remove the material 264 selectively to the liner material 263, which, in one illustrative embodiment, may be accomplished on the basis of ammonium hydroxide in combination with hydrogen peroxide. For this purpose, the ammonium hydroxide ($NH_4OH$) and the hydrogen peroxide may be provided as a diluted solution, which may exhibit a moderately high etch rate for materials such as titanium nitride, tantalum nitride and the like, while the etch resistivity of dielectric materials, such as silicon nitride, silicon and oxygen-containing dielectric materials and the like, may be moderately high so that the removal of the thin layer 264 may not result in a significant damage of the layer 262. Consequently, during the etch process 206, the liner 263 may efficiently act as an etch stop material, thereby efficiently suppressing any undue damage of the lower lying sensitive material. Moreover, during the etch process 206, the material 264 may also be removed from sidewall areas 260S, thereby exposing the liner 266. Consequently, improved uniformity may be obtained within the opening 260O of the gate electrode structure 260B after the deposition of a work function adjusting material for the transistor 250B. It should be appreciated that the etch rate during the process 206 based on ammonium hydroxide may depend on the composition, i.e., concentration of the various components, the temperature of the wet chemical solution, the material characteristics of the layer 264 so that, by giving conditions for these parameters, the etch process may be controlled by the etch time so as to substantially completely remove the material 264 within the opening 260O. For example, appropriate process parameters for a given composition of the material layer 264 may be readily determined by selecting a plurality of different parameters for the etch process 206, such as different concentration, different temperature, thereby obtaining corresponding etch rates for the various process parameters. Consequently, the etch recipe based on ammonium hydroxide provides a high degree of flexibility in determining appropriate process parameters for removing tantalum nitride material that may be formed on the basis of any desired deposition technique which may thus result in different material characteristics. Furthermore, the parameters of the process 206 may also be appropriately adapted to the characteristics of the liner material 263, for instance, the thickness and material composition thereof, so as to obtain an appropriate removal rate in combination with an etch time, substantially without compromising the material layers 262 and 261 during the process 206.

Figure 2C:
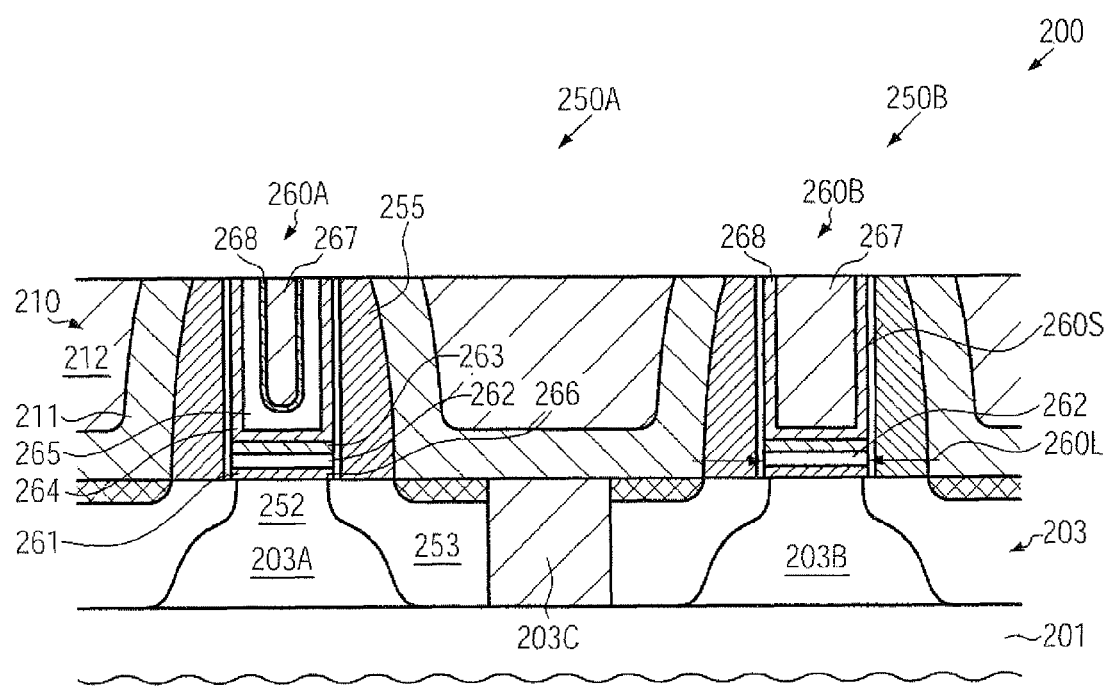

FIG. 2c schematically illustrates the semiconductor device 200 in a further advanced manufacturing stage. As illustrated, a work function adjusting material 268 may be formed in the second gate electrode structure 260B followed by an electrode material 267, which may represent any appropriate metal-containing material, such as aluminum, tungsten and the like. Similarly, in the embodiment shown, the work function adjusting material 268 may also be formed in the gate electrode structure 260A on the previously provided work function adjusting material 265, followed by the electrode material 267. It should be appreciated that, in other illustrative embodiments, the material 268 may be removed from the gate electrode structure 260A, if considered appropriate. The material 268 may be formed on the basis of any appropriate deposition technique, such as CVD, sputter deposition, wherein, however, process parameters may be selected without any pre-sputter etch phase in order to not unduly compromise the sensitive materials 262 and 261. For example, a plurality of appropriate materials, such as lanthanum, aluminum and the like, may be deposited on the basis of a plasma free ambient, thereby not unduly compromising the sensitive materials in the gate electrode structure 260B. Due to the previous substantially complete removal of the material 264, the material 268 may also be deposited on the dielectric sidewall surface areas 260S so that the material 268 may extend across the entire length, indicated as 260L, of the gate electrode structure 260B. Consequently, superior uniformity of the resulting work function across the entire length and width of the transistor 250B may be accomplished. After the deposition of the material 268, an appropriate gate electrode material may be deposited commonly in the gate electrode structures 260A, 260B by using any appropriate deposition technique. For example, aluminum, tungsten, or even highly conductive materials such as copper, may be used if a sufficient copper confinement capability of the materials 268, 262 may suppress undue copper diffusion into sensitive areas of the transistors 250A, 250B, such as the corresponding active regions 203A, 203B. As previously explained, in some embodiments, after the deposition of the material 268, a portion thereof may be removed from the gate electrode structure 260A, if considered appropriate, for instance, by providing an appropriate etch mask and using the material 265 as an efficient stop material, wherein even a pronounced etch selectivity may not be required, as long as a thickness of the material 265 may be greater than a thickness of the material 268.

After the deposition of the common electrode material 267, any excess material may be removed, for instance by CMP and the like. Prior to or after the removal of any excess material, if required, a heat treatment may be performed so as to diffuse the metal species towards the cap layer 262 and the gate insulation layer 261, thereby obtaining the final work function for the gate electrode structures 260A, 260B. Thereafter, the further processing may be continued by depositing a further interlayer dielectric material and forming contact elements therein so as to connect to the transistors 250A, 250B as required by the overall circuit configuration.

Figure 2D:
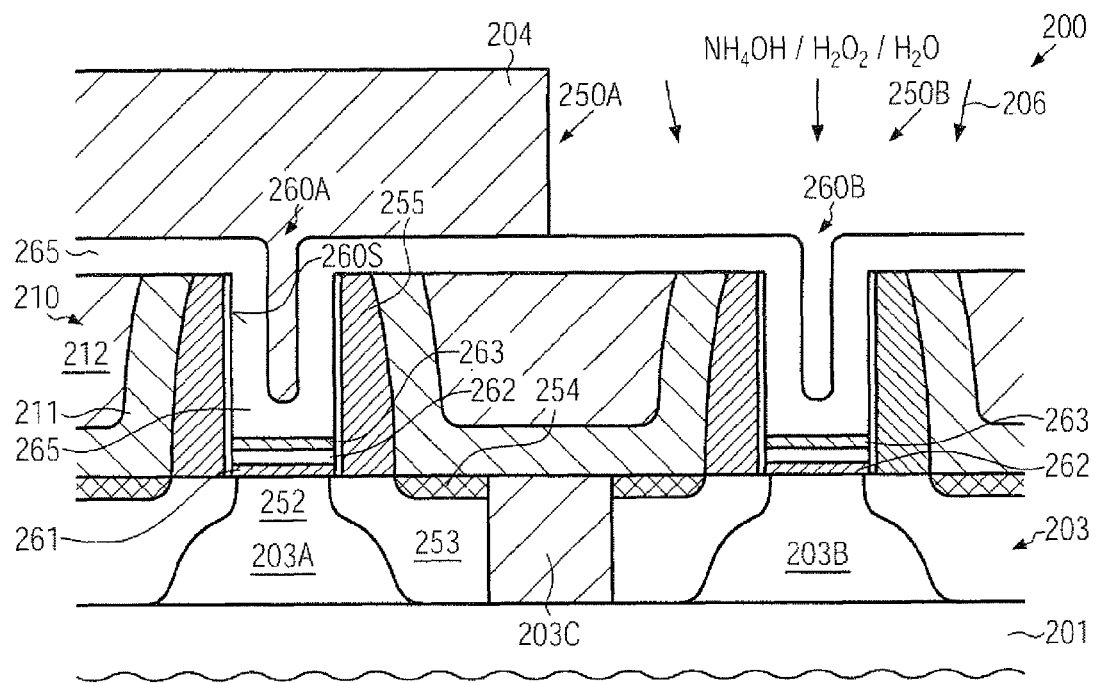
FIGS. 2d-2e schematically illustrate cross-sectional views of the semiconductor device according to further illustrative embodiments in which a work function adjusting material, such as a titanium nitride material, may be selectively removed on the basis of a wet chemical etch recipe without providing an additional conductive etch stop material by using a silicon and oxygen-containing material liner formed on a conductive cap material, according to still further illustrative embodiments.

FIG. 2d schematically illustrates the semiconductor device 200 according to still further illustrative embodiments. As illustrated, the first work function adjusting material 265, for instance in the form of a titanium nitride material, may be formed in the first and second gate electrode structures 260A, 260B without providing a conductive barrier or etch stop material, such as a tantalum nitride layer, as previously explained with reference to FIGS. 2a-2c. In this case, the material 265 may be directly formed on the liner material 263 and the dielectric sidewall surface areas 260S in the first and second gate electrode structures 260A, 260B. Moreover, in the manufacturing stage shown, the device 200 comprising the etch mask 204 may be exposed to the etch ambient 206, which may, in some illustrative embodiments, be established on the basis of ammonium hydroxide and hydrogen peroxide, as previously discussed, which may also efficiently etch titanium nitride material selectively with respect to the liner material 263. With respect to the determination of appropriate parameters, the same criteria may apply as previously explained with reference to FIG. 2b. Consequently, an appropriate temperature, concentration and etch time may be determined for given material characteristics of the layer 265 so as to not unduly compromise integrity of the cap material 262 in the second gate electrode structure 260B.

Figure 2E:
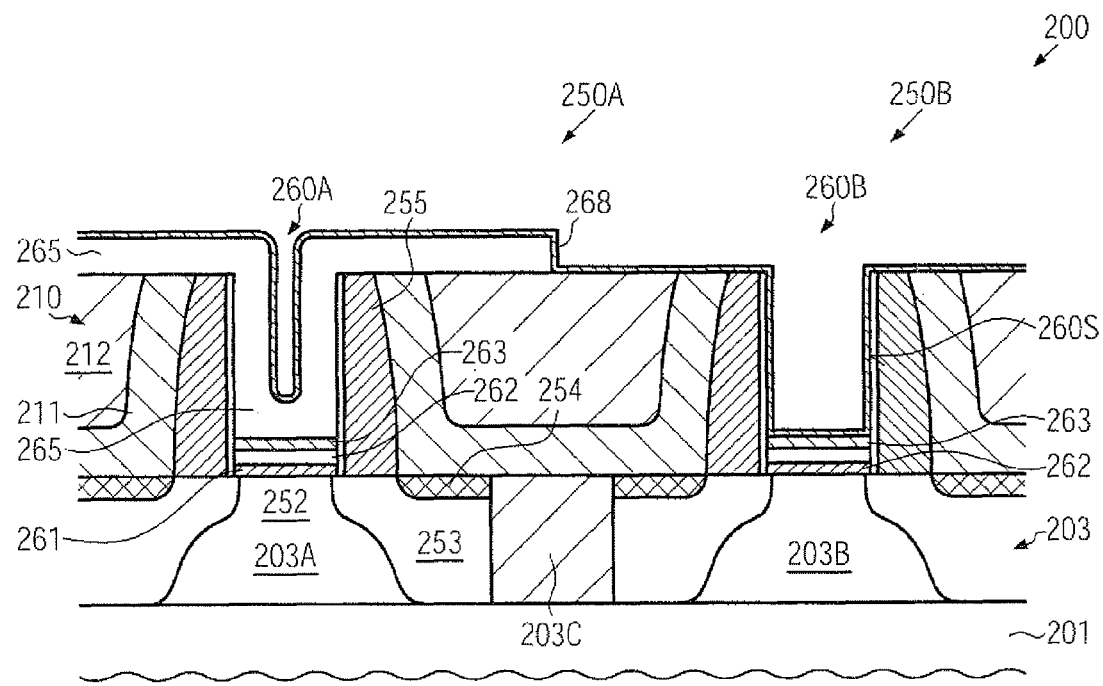

FIG. 2e schematically illustrates the semiconductor device 200 in a further advanced manufacturing stage in which the second work function adjusting material 268 may be formed in the first and second gate electrode structures 260A, 260B. As illustrated, the material 268 may also be directly formed on the sidewall surface areas and the remaining liner 263, thereby obtaining the superior process conditions during the subsequent processing for adjusting the final work function of the gate electrode structure 260B. On the other hand, also the first material 265 may be formed in close proximity to the cap material 263 and may extend across the entire length of the gate electrode structure 260A, thereby also providing superior process conditions in adjusting the final work function. On the other hand, the layer 265 may represent a diffusion resistance for the material 268 during the subsequent processes, such as a heat treatment, thereby substantially determining the threshold voltage on the basis of the species in the layer 265. It should be appreciated, however, that the material 268 may be selectively removed from the gate electrode structure 260A, if considered appropriate, as previously explained.

Thereafter, the further processing may be continued by depositing a common electrode material and removing any excess material thereof, as discussed above.

As a result, the present disclosure provides semiconductor devices and manufacturing techniques in which the work function of different gate electrode structures may be adjusted in a very late manufacturing stage, i.e., after forming drain and source regions of corresponding transistor elements without applying any aggressive etch processes, such as sputter etch processes for selectively removing one or more material layers, which may be provided for adjusting the work function of one type of transistor. For this purpose, at least one of the material layers may be removed on the basis of a wet chemical etch recipe, thereby substantially suppressing the damaging of the sensitive underlying materials, such as the conductive cap material and the high-k dielectric material. For example, tantalum nitride, which may be used as an efficient barrier or etch stop material, may be subsequently efficiently removed on the basis of an ammonium hydroxide agent without significantly compromising the underlying material layers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    removing a placeholder material of a first gate electrode structure and a second gate electrode structure;
    forming a first work function adjusting material layer in said first and second gate electrode structures, said first work function adjusting material layer comprising a tantalum nitride layer;
    removing a portion of said first work function adjusting material layer from said second gate electrode structure by using said tantalum nitride layer as an etch stop layer;
    removing said tantalum nitride layer by performing a wet chemical etch process; and
    forming a second work function adjusting material layer in said second gate electrode structure and above a non-removed portion of said first work function adjusting material layer in said first gate electrode structure.

2. The method of claim 1, wherein said first work function adjusting material layer comprises a titanium nitride layer formed above said tantalum nitride layer.

3. The method of claim 1, wherein said wet chemical etch process is performed on the basis of ammonium hydroxide.

4. The method of claim 2, wherein said titanium nitride layer is removed by performing a wet chemical etch process based on sulphuric acid.

5. The method of claim 1, further comprising providing an etch stop liner at least in said second gate electrode structure between a metal-containing cap material formed on a high-k dielectric material and said placeholder material, wherein said tantalum nitride layer is removed selectively to said etch stop liner.

6. The method of claim 5, wherein said etch stop liner comprises a silicon and oxygen.

7. The method of claim 6, wherein said etch stop liner is provided in said first and second gate electrode structures.

8. The method of claim 7, wherein said etch stop liner is removed from said first gate electrode structure prior to forming said first work function adjusting material layer.

9. The method of claim 5, wherein removing said placeholder material from said second gate electrode structure comprises using said etch stop liner as an etch stop during a placeholder material removal process.

10. A method, comprising:
    forming a first gate electrode structure of a first transistor above a first semiconductor region of a semiconductor device and a second gate electrode structure of a second transistor above a second semiconductor region of said semiconductor device, each of said first and second gate electrode structures comprising a gate insulation layer comprised of a high-k dielectric material, a metal-containing cap material formed above said gate insulation layer, and a placeholder material formed above said metal-containing cap material;
    forming first and second opening in said first and second gate electrode structures, respectively by removing at least a portion of said placeholder material therefrom;
    forming a first work function adjusting material comprising a first work function metal for said first transistor in each of said first and second openings, wherein said first work function adjusting material comprises at least a first layer and a second layer formed above said first layer;
    selectively removing at least said second layer from said second opening by using said first layer as an etch stop layer; and
    forming a second work function adjusting material comprising a second work function metal for said second transistor in at least said second opening.

11. The method of claim 10, wherein said first layer of said first work function adjusting material comprises tantalum nitride and said second layer comprises a metal-containing material layer.

12. The method of claim 10, wherein selectively removing said second layer of said first work function adjusting material from said second opening comprises performing a wet chemical etch process.

13. The method of claim 10, further comprising selectively removing said first layer of said first work function adjusting material from said second opening prior to forming said second work function adjusting material.

14. The method of claim 13, wherein at least said second gate electrode further comprises a liner material formed above said metal-containing cap material, and wherein selectively removing said first layer of said first work function adjusting material from said second opening comprises using said liner material as an etch stop layer during an etch process.

15. The method of claim 14, wherein forming said liner material comprises forming a first layer portion of said placeholder material above said metal-containing cap material, incorporating oxygen into said first layer portion, and thereafter forming a second layer portion of said placeholder material above said first layer portion.

16. The method of claim 13, wherein removing at least said portion of said placeholder material from said second opening comprises using said liner material as an etch stop during a placeholder material removal process.

17. The method of claim 10, further comprising forming drain and source regions in said first and second semiconductor regions and forming at least a portion of an interlayer dielectric material prior to removing said placeholder material.

18. The method of claim 10, wherein forming said first and second gate electrode structures comprises forming a silicon dioxide base material and forming said high-k dielectric material on said silicon dioxide base material.

19. The method of claim 10, wherein forming said second work function adjusting material comprises forming said second work function adjusting material in said first opening, the method further comprising thereafter forming an electrode material in said first and second openings.

20. The method of claim 19, further comprising selectively removing said second work function adjusting material from said first opening prior to forming said electrode material.

* * * * *